(12) United States Patent
Rogers et al.

(10) Patent No.: US 12,125,818 B2
(45) Date of Patent: Oct. 22, 2024

(54) TECHNOLOGIES FOR PLASMA OXIDATION PROTECTION DURING HYBRID BONDING OF SEMICONDUCTOR DEVICES

(71) Applicant: Tokyo Electron Limited, Tokyo (JP)

(72) Inventors: Jack Rogers, Albany, NY (US); Satohiko Hoshino, Albany, NY (US); Nathan Antonovich, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 427 days.

(21) Appl. No.: 17/669,236

(22) Filed: Feb. 10, 2022

(65) Prior Publication Data

US 2023/0253361 A1 Aug. 10, 2023

(51) Int. Cl.
*H01L 21/00* (2006.01)
*H01L 23/00* (2006.01)

(52) U.S. Cl.
CPC .............. *H01L 24/80* (2013.01); *H01L 24/08* (2013.01); *H01L 2224/08145* (2013.01);
(Continued)

(58) Field of Classification Search
CPC ..................... H01L 24/80; H01L 24/08; H01L 2224/08145; H01L 2224/80013; H01L 2224/8002; H01L 2224/80895; H01L 2224/80896; H01L 2924/0509; H01L 24/05; H01L 25/0657; H01L 2224/80357; H01L 2224/0401; H01L 24/06; H01L 24/73; H01L 24/09; H01L 2224/32145; H01L 2224/09517; H01L 2224/0603; H01L 2224/80201; H01L 2224/08148; H01L 2224/08237; H01L 25/043; H01L 25/0756;
(Continued)

(56) References Cited

U.S. PATENT DOCUMENTS 9,418,834 B2  8/2016  Negreira et al.
10,796,913 B2  10/2020  Lin
(Continued)

FOREIGN PATENT DOCUMENTS

WO  2016152513 A1  9/2016
WO  2020227961 A1  11/2020

OTHER PUBLICATIONS

Korean Intellectual Property Office, International Search Report and Written Opinion for International application No. PCT/US2023/012741, mailed May 30, 2023, 11pp.

*Primary Examiner* — Niki H Nguyen

(57) ABSTRACT

Technologies for plasma oxidation protection during hybrid bonding of semiconductor devices includes forming a blocking layer on a metallic bonding pad formed in a bonding surface of a semiconductor device to be bonded and performing a surface treatment on the bonding surface to increase the bonding strength of the bonding surface and contemporaneously remove the blocking layer from the metallic bonding pad. In an illustrative embodiment, the blocking layer is embodied as a self-assembled monolayer (SAM), and the surface treatment is embodied as a surface activation plasma (SAP) treatment. A diffusion barrier layer, such as a silicon carbon nitride layer, may form the bonding surface in some embodiments to reduce diffusion of the metallic bonding pad during an annealing treatment of the bonding process.

22 Claims, 12 Drawing Sheets

(52) U.S. Cl.
CPC ............... *H01L 2224/80013* (2013.01); *H01L 2224/8002* (2013.01); *H01L 2224/80895* (2013.01); *H01L 2224/80896* (2013.01); *H01L 2924/0509* (2013.01)

(58) Field of Classification Search
CPC ... H01L 2224/0558; H01L 2224/08111; H01L 2224/0903; H01L 2224/06515; H01L 27/1469; H01L 21/187; H01L 2224/08113; H01L 2224/08235; H01L 2224/09051; H01L 2224/80125; H01L 2224/85201; H01L 2224/0812; H01L 2224/2908; H01L 2224/838; H01L 2224/83801; H01L 2224/09505; H01L 2224/09515; H01L 2224/29019; H01L 2224/2958; H01L 2224/48228; H01L 2224/8182; H01L 2224/85203

See application file for complete search history.

(56) References Cited

U.S. PATENT DOCUMENTS

| | | | |
|---|---|---|---|
| 2014/0011324 A1* | 1/2014 | Liu | H01L 24/74 |
| | | | 438/455 |
| 2015/0108644 A1* | 4/2015 | Kuang | H01L 25/50 |
| | | | 257/777 |
| 2015/0287694 A1 | 10/2015 | Liu | |
| 2017/0309603 A1 | 10/2017 | Chen | |
| 2021/0143115 A1* | 5/2021 | Wu | H01L 25/50 |
| 2021/0320075 A1* | 10/2021 | Hou | H01L 24/05 |

* cited by examiner

TECHNOLOGIES FOR PLASMA OXIDATION PROTECTION DURING HYBRID BONDING OF SEMICONDUCTOR DEVICES

FIELD OF THE DISCLOSURE

The present disclosure relates generally to hybrid bonding and, more particularly, to technologies for plasma oxidation protection of bonding pads during hybrid bonding of semiconductor devices.

BACKGROUND

Hybrid bonding is a semiconductor fabrication technique in which two semiconductor devices (e.g., semiconductor wafers or substrates), each formed from multiple materials, are attached to each other. For example, each semiconductor device may be formed from semiconductor materials, dielectric materials, and/or metallic materials arranged in common with each other to facilitate the bonding of semiconductor-to-semiconductor, dielectric-to-dielectric, and metal-to-metal. In some techniques, metallic bonding pads (e.g., copper bonding pads) are formed in a dielectric layer (and/or the semiconductor substrate itself) to facilitate metal-to-metal bonding of the semiconductor substrates. The bonding procedure typically includes an annealing treatment of the semiconductor devices (e.g., wafers) to cause hydrogen bonding between the in-common semiconductor and dielectrics areas and fusion bonding between the metallic areas.

In some hybrid bonding techniques, the bonding surfaces of the semiconductor devices, which typically include dielectrics, are initially prepared via a surface treatment, such as a surface activation plasma (SAP) treatment. The SAP treatment modifies the bonding surfaces of the semiconductor devices to improve the bonding characteristics of those bonding surfaces. For example, typical SAP treatments can improve the bonding strength between the dielectric layers of two semiconductor devices. However, certain SAP treatments can also produce a significant layer of oxide on any metallic areas (e.g., the metallic bonding pads) of the semiconductor devices. If the thickness of the oxide becomes too great, the oxide can interfere with the bonding procedure and reduce the overall bonding strength exhibited between the semiconductor devices, as well as degrade electrical performance of the semiconductor devices.

SUMMARY

According to an aspect of the disclosure, a method for hybrid bonding a semiconductor device may include forming a blocking layer on a metallic bonding pad formed in a bonding surface of a first semiconductor device and performing a surface treatment on the bonding surface of the first semiconductor device. The surface treatment may be configured to increase a bonding strength of the bonding surface of the first semiconductor device and substantially remove the blocking layer from the metallic bonding pad. The blocking layer limits exposure of the metallic bonding pad to the surface treatment. The method may also include contacting the bonding surface of the first semiconductor device to a bonding surface of second semiconductor device and annealing the first and second semiconductor devices while the first and second semiconductor devices are in contact with each other to bond the first semiconductor device to the second semiconductor device.

In some embodiments, forming a blocking layer on the metallic bonding pad may include forming a self-assembled monolayer (SAM) on the metallic bonding pad. For example, forming the self-assembled monolayer (SAM) on the metallic bonding pad may include spin coating the SAM onto the metallic bonding pad. Additionally, in some embodiments, performing the surface treatment on the bonding surface of the first semiconductor device may include creating a plurality of dangling bonds on the bonding surface of the first semiconductor device to increase the bonding strength of the bonding surface of the first semiconductor device.

Additionally, in some embodiments, performing the surface treatment on the bonding surface of the first semiconductor device may include performing a surface activation plasma (SAP) treatment on the bonding surface of the first semiconductor device. For example, performing the surface activation plasma (SAP) treatment may include performing an Oxygen SAP treatment on the bonding surface of the first semiconductor device. In such embodiments, the Oxygen SAP treatment may be performed at a power level between 40 watts and 60 watts. For example, a 50 watt Oxygen SAP treatment may be performed on the bonding surface of the first semiconductor device.

The method may also include forming an insulator layer on a silicon substrate of the semiconductor device and forming a diffusion barrier layer on the insulator layer. The diffusion barrier layer may embody the bonding surface of the first semiconductor device and may be configured to restrict diffusion of the metallic bonding pad during the annealing of the first and second semiconductor devices. Additionally, in some embodiments, the diffusion barrier layer on the insulator layer may be embodied as a silicon carbon nitride layer.

In some embodiments, forming the blocking layer on the metallic bonding pad comprises may include a self-assembled monolayer (SAM) on the metallic bonding pad, and performing the surface treatment on the bonding surface of the first semiconductor device may include performing an Oxygen surface activation plasma (SAP) treatment on the bonding surface of the first semiconductor device. For example, performing the Oxygen surface activation plasma (SAP) treatment may include performing a 50 watt Oxygen SAP treatment on the bonding surface of the first semiconductor device.

Additionally, in some embodiments, the method may also include forming a blocking layer on a metallic bonding pad formed in the bonding surface of the second semiconductor device and performing the surface treatment on the bonding surface of the second semiconductor device. The surface treatment may be configured to increase a bonding strength of the bonding surface of the second semiconductor device and substantially remove the blocking layer from the metallic bonding pad of the second semiconductor. The blocking layer may limit exposure of the metallic bonding pad of the second semiconductor to the surface treatment. For example, forming the blocking layer on the metallic bonding pad of the second semiconductor device may include forming a self-assembled monolayer (SAM) on the metallic bonding pad of the second semiconductor device. Additionally, performing the surface treatment on the bonding surface of the second semiconductor device may include performing an Oxygen surface activation plasma (SAP) treatment on the bonding surface of the second semiconductor device.

According to another aspect of the disclosure, a method for hybrid bonding a semiconductor device may include forming an insulator layer on a silicon substrate of a first semiconductor device, forming a diffusion barrier layer on the insulator layer, forming a plurality of metallic bonding pads in the diffusion barrier layer, forming a self-assembled monolayer (SAM) on each metallic bonding pad of the plurality of metallic bonding pads, and performing a surface activation plasma (SAP) treatment on the diffusion barrier layer. The diffusion barrier layer may be embodied as a silicon carbon nitride layer, and the SAP treatment may be configured to increase a bonding strength of the diffusion barrier layer and substantially remove the SAM from each of the metallic bonding pads. The blocking layer may limit exposure of each of the metallic bonding pads to the SAP treatment. The method may also include contacting the diffusion barrier layer of the first semiconductor device to a bonding surface of second semiconductor device and annealing the first and second semiconductor devices while the first and second semiconductor devices are in contact with each other to bond the first semiconductor device to the second semiconductor device. The diffusion barrier layer may be configured to restrict diffusion of the metallic bonding pads in the diffusion barrier layer during the annealing of the first and second semiconductor devices.

In some embodiments, performing the surface activation plasma (SAP) treatment on the diffusion barrier layer may include performing an Oxygen SAP treatment on the diffusion barrier layer. For example, performing the Oxygen surface activation plasma (SAP) treatment may include performing an Oxygen SAP treatment on the diffusion barrier layer at a power level between 40 watts and 60 watts, such as a 50 watt Oxygen SAP treatment.

According to a further aspect of the disclosure, a method for hybrid bonding semiconductor devices includes forming a self-assembled monolayer (SAM) on a metallic bonding pad formed in a bonding surface of a first semiconductor device and on a metallic bonding pad formed in a bonding surface of a second semiconductor device and performing a surface activation plasma (SAP) treatment on the bonding surface of the first semiconductor device and on the bonding surface of the second semiconductor device. The SAP treatment may be configured to increase a bonding strength of the bonding surface of the first and second semiconductor devices and substantially remove the SAM from the metallic bonding pad of the first and second semiconductor device. The SAM limits exposure of the metallic bonding pads to the surface treatment.

The method may also include contacting the bonding surface of the first semiconductor device to the bonding surface of second semiconductor device and annealing the first and second semiconductor devices while the first and second semiconductor devices are in contact with each other to bond the first semiconductor device to the second semiconductor device. Additionally, in some embodiments, the method may include forming an insulator layer on a silicon substrate of the first semiconductor device, forming an insulator layer on a silicon substrate of the second semiconductor device, and forming a first silicon carbon nitride layer on the insulator layer of the first semiconductor device. The first silicon carbon nitride layer may embody the bonding surface of the first semiconductor device and may be configured to restrict diffusion of the metallic bonding pad of the first semiconductor device during the annealing of the first and second semiconductor device. The method may also include forming a second silicon carbon nitride layer on the insulator layer of the second semiconductor device. The second silicon carbon nitride layer may embody the bonding surface of the second semiconductor device and may be configured to restrict diffusion of the metallic bonding pad of the second semiconductor device during the annealing of the first and second semiconductor devices.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
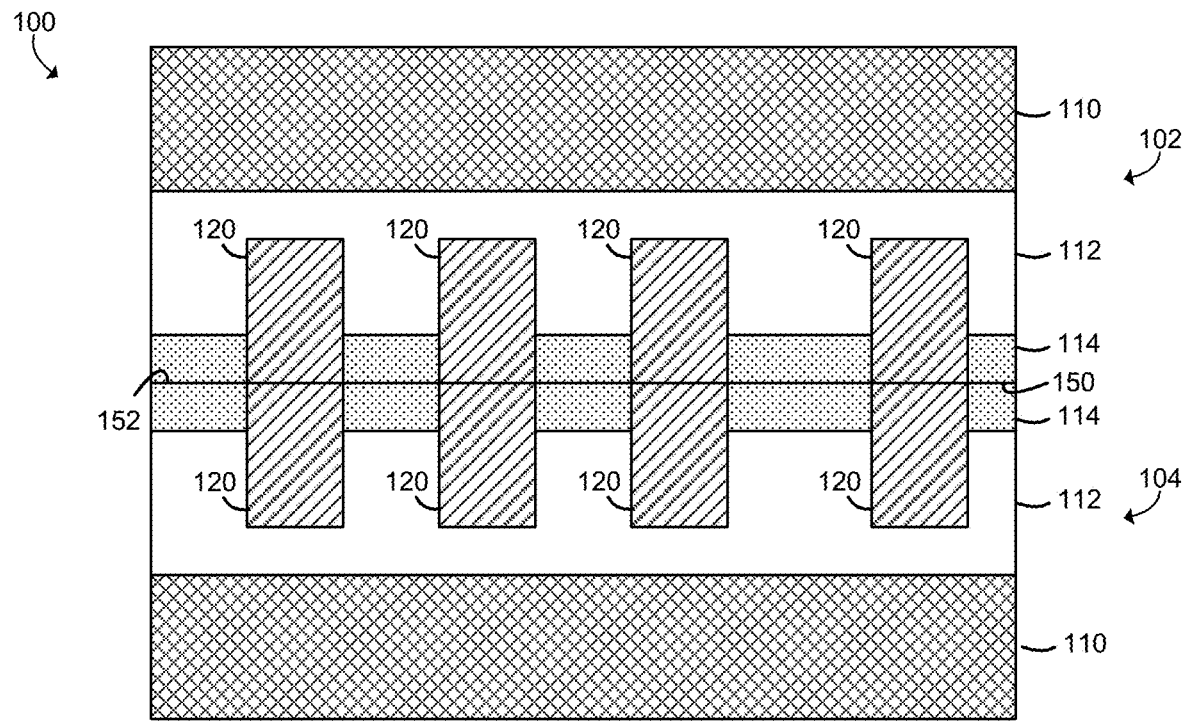
FIG. 1 is a cross-sectional, elevation view of at least one embodiment of a semiconductor device structure including a pair of semiconductor devices, each having a bonding surface that includes a diffusion barrier layer, bonded to each other according to the methodologies discussed herein.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); or (A, B, and C). Similarly, items listed in the form of "at least one of A, B, or C" can mean (A); (B); (C): (A and B); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring to FIG. 1, an illustrative semiconductor device structure 100 includes a first semiconductor device 102 bonded to a second semiconductor device 104 using the hybrid bonding methodologies disclosed herein. The semiconductor devices 102, 104 may be embodied as pre- or post-processed semiconductor wafers, dies, or "chips" and may include a number of semiconductor sub-devices formed thereon, such as various transistors, memory devices, electrical circuits, semiconductor components, and the like. Each of the semiconductor devices 102, 104 includes a silicon substrate 110 and an insulator layer 112 formed on the silicon substrate 110. The insulator layer 112 of the semiconductor devices 102, 104 may be formed from any suitable insulator material capable of being bonded to each other using the disclosed methodologies. For example, in the illustrative embodiment, the insulator layers 112 are embodied as silicon oxide layers, which may be formed from Tetraethyl Orthosilicate (TEOS).

Each of the semiconductor devices 102, 104 also includes a diffusion barrier layer 114 and a number of metallic bonding pads 120 formed in the diffusion barrier layer 114 and extending into the insulator layer 112. The diffusion barrier layer 114 may be embodied as any type of material capable of restricting or limiting the diffusion of the metallic bonding pads 120 into the insulator layer 112 during subsequent annealing treatments, as discussed in more detail below. For example, in the illustrative embodiment, the diffusion barrier layer 114 is embodied as a silicon carbon nitride layer and may be formed on the insulator layer 112 through any suitable formation technique such as a chemical vapor deposition (CVD) or atomic layer deposition (ALD). The metallic bonding pads 120 may be formed from any suitable metal capable of bonding with the metallic bonding pads 120 of the other semiconductor device 102, 104 during the bonding methodology discussed herein. For example, in the illustrative embodiment, the metallic bonding pads 120 are formed from Copper (Cu) and may be recessed slightly relative to the top surface of the diffusion barrier layer 114 to allow the Copper bonding pad 120 to expand during the hybrid bonding procedure. In some embodiments, the metallic bonding pads 120 may form electrical interconnections between the first and second semiconductor devices 102, 104. In other embodiments, however, the metallic bonding pads 120 are embodied as "dummy" pads formed in the semiconductor devices 102, 104 to promote the bonding of those devices 102, 104.

The diffusion barrier layer 114 of the first semiconductor device 102 includes an outer surface, opposite the insulator layer 112, which forms a bonding surface 150 of the first semiconductor device 102. Similarly, the second semiconductor device 104 includes an outer surface, opposite the insulator layer 112, which forms a bonding surface 152 of the second semiconductor device 104. The bonding surfaces 150, 152 are configured to be bonded to each other. To do so, the bonding surfaces 150, 152 are brought into physical contact with each other, and the semiconductor device structure 100 undergoes an annealing treatment as discussed in more detail below.

To promote the bonding of the bonding surfaces 150, 152, one or both of the bonding surfaces 150, 152 are treated with a surface treatment to prepare or "activate" the bonding surfaces 150, 152 and thereby promote bonding. For example, in the illustrative embodiment and as discussed in more detail below, a surface activation plasma (SAP) treatment is performed on the bonding surfaces 150, 152. The SAP treatment increases the bonding strength of the bonding surfaces 150, 152 by establishing dangling bonds on the surfaces 150, 152, which facilitates hydrogen bonding between the diffusion barrier layers 114. However, some surface treatments, including some SAP treatments, can have a negative impact on the bonding capability and/or bonding strength of the metallic bonding pads 120. For example, the surface treatment can cause an excessive build-up (i.e., thickness) of an oxide layer on the metallic bonding pads 120, which reduces the metal-to-metal bonding strength between the metallic bonding pads 120.

As such, to reduce or otherwise limit the exposure of the metallic bonding pads 120 to the surface treatment, a blocking layer is formed on each of the metallic bonding pads 120 prior to the surface treatment. The blocking layer may be formed from any suitable material capable of limiting or reducing the exposure of the bonding pads 120 to the selected surface treatment. For example, in the illustrative embodiment and as discussed in more detail below, the blocking layer is formed from a self-assembled monolayer (SAM), which is spin coated onto the metallic bonding pads 120. Additionally, the surface treatment is selected (e.g., the type of plasma and power applied) such that the surface treatment properly treats the bonding surfaces 150, 152 (i.e., the diffusion barrier layers 114 in the embodiment of FIG. 1) while contemporaneously substantially removing the blocking layer from the metallic bonding pads 120 without excessive build-up of oxide on the metallic bonding pads 120. In this way, no further etching or removal process is required to subsequently remove the blocking layer from the metallic bonding pads 120 after the surface treatment has been performed.

Figure 2:
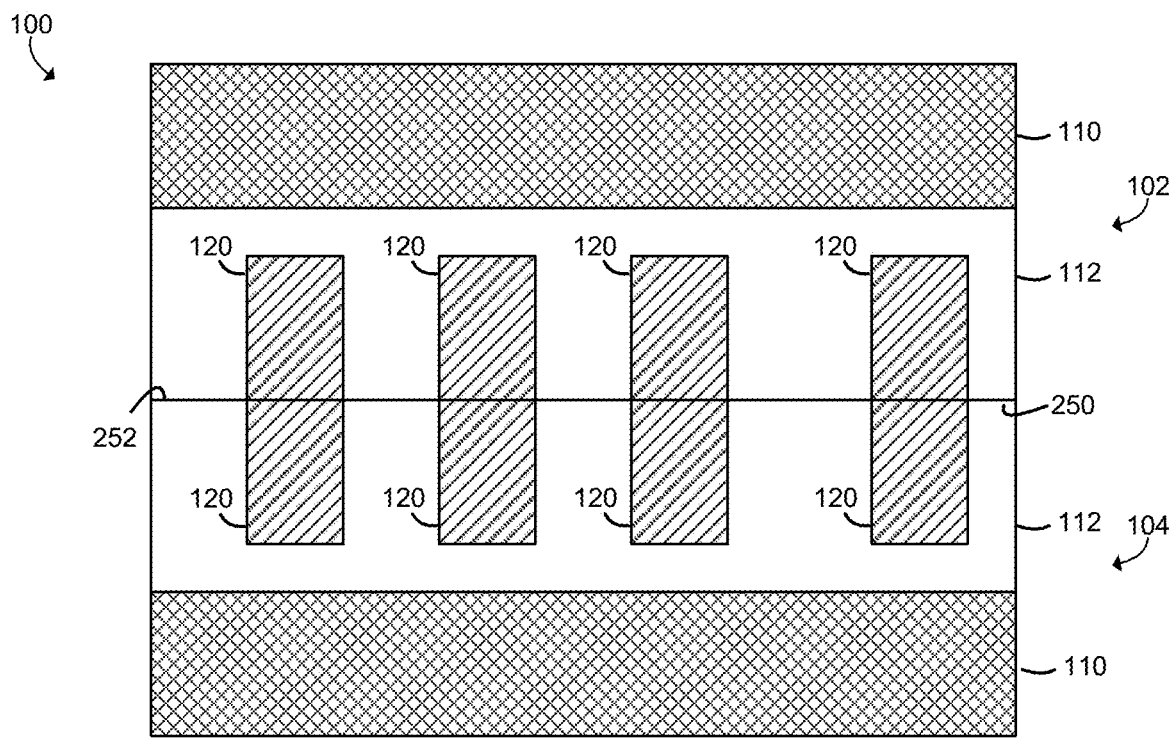
FIG. 2 is a cross-sectional, elevation view of another embodiment of a semiconductor device structure including a pair of semiconductor devices having bonding surfaces devoid of a diffusion barrier layer and bonded to each other according to the methodologies discussed herein.

In some embodiments, as shown in FIG. 2, the semiconductor devices 102, 104 may not include the diffusion barrier layer 114. In such embodiments, the outer surface of each insulator layer 112, opposite the silicon substrate 110, defines bonding surfaces 250, 252, respectively, of the semiconductor devices 102, 104. Additionally, in such embodiments, the surface treatment is performed on the bonding surfaces 250, 252 of the insulator layers 112 to prepare the insulator layers 112 for bonding with each other. As discussed above, such surface treatment prepares or "activates" the bonding surfaces 250, 252 by establishing dangling bonds on the bonding surfaces 250, 252, which facilitates the hydrogen bonding of the bonding surfaces 250, 252. Additionally, as discussed above and in more detail below, a blocking layer may be formed on each of the metallic bonding pads 120 of the semiconductor devices 102, 104 of FIG. 2 to limit the exposure of the bonding pads 120 to the surface treatment to thereby reduce any oxide buildup on the metallic bonding pads 120.

It should be appreciated that the semiconductor devices 102, 104 shown in FIGS. 1 and 2 and the remaining figures described herein, are simplified, abstracted illustrations of possible semiconductor devices (e.g., semiconductor wafers, dies, or "chips"). As such, it should be further appreciated that such semiconductor devices 102, 104 may include additional or different architectures, layers, devices, portions, and/or structures, which are not shown in the associated figures for clarity of the drawings, in other embodiments depending on the type and complexity of the semiconductor devices 102, 104. Furthermore, it should be appreciated that, while various layers of the semiconductor devices 102, 104 have been described as being formed "on" another layer of the semiconductor devices 102, 104, such layers may be formed directly on top of the other layer or may have one or more other intervening layers between the two described layers (e.g., insulator layers).

Figure 3A:
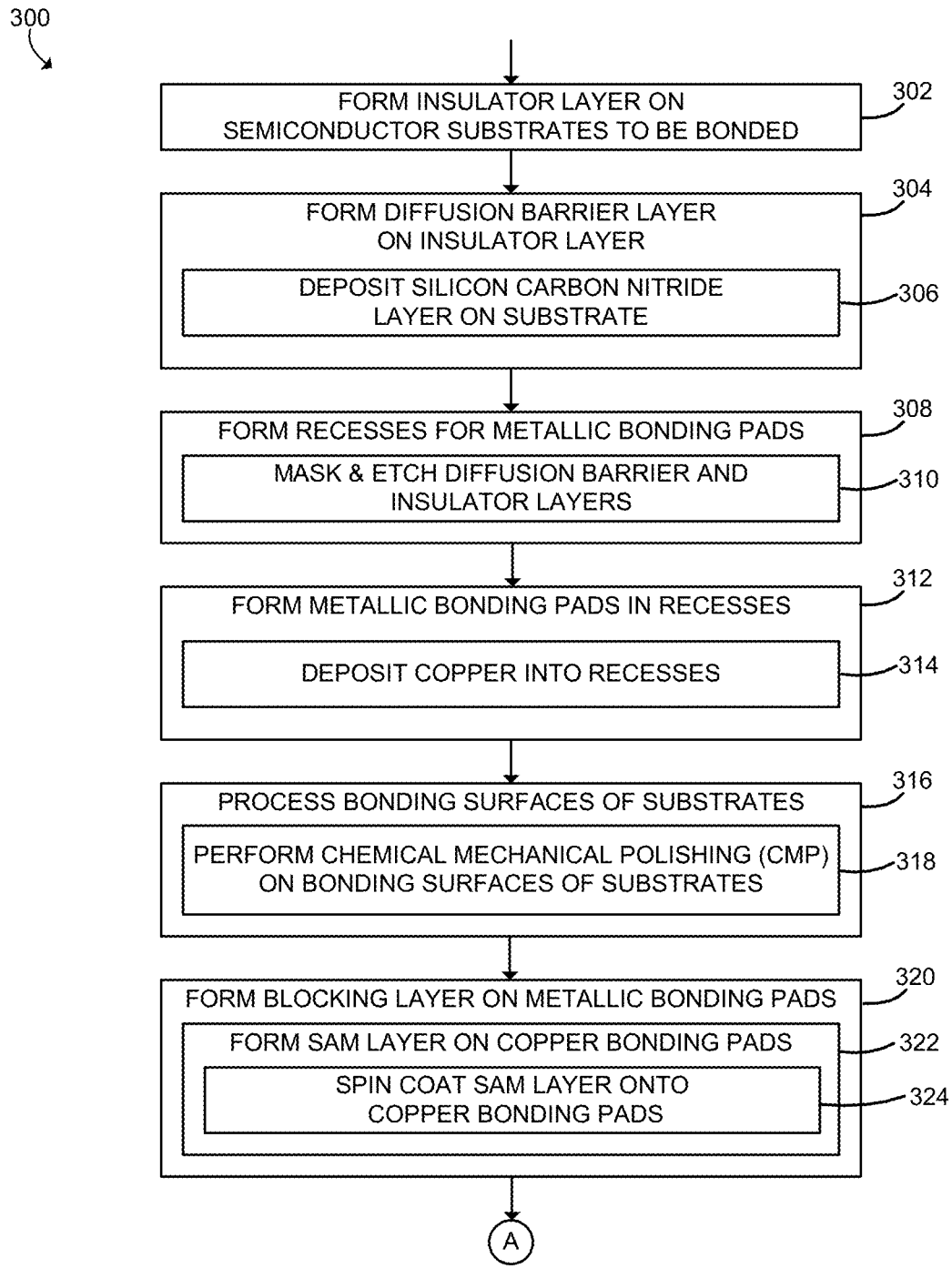
FIGS. 3A-3B are a simplified flow chart of at least one embodiment of a method for hybrid bonding the semiconductor devices of FIGS. 1 and 2.
Figure 3B:
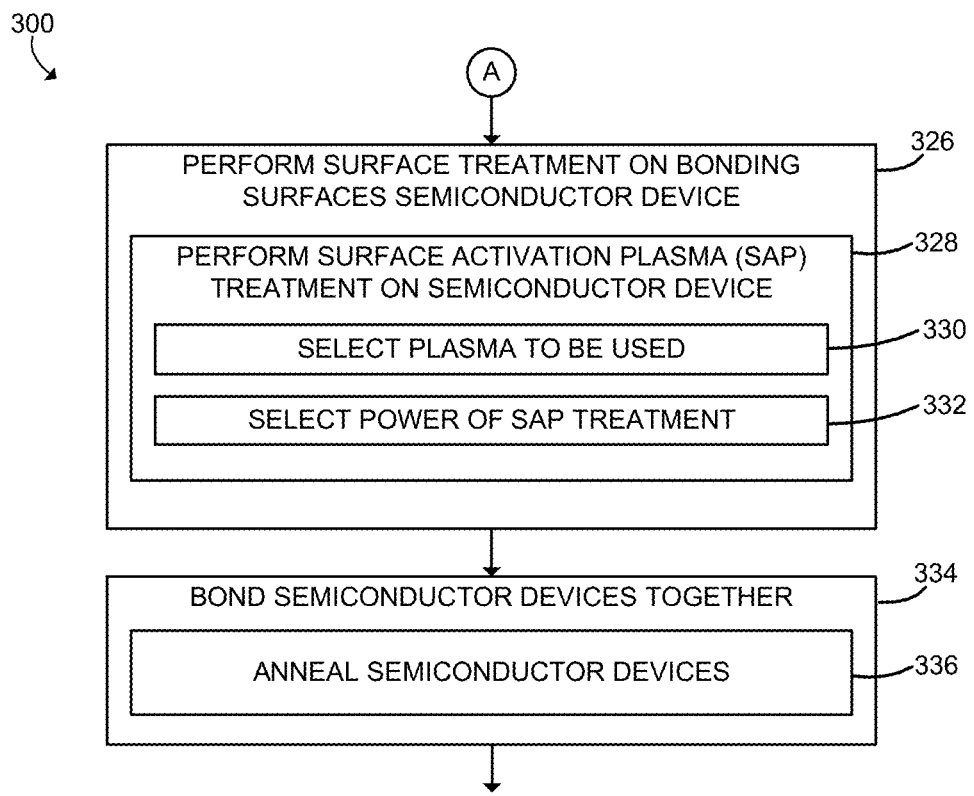

Referring now to FIGS. 3A and 3B, in some embodiments, a method 300 may be performed to hybrid bond two or more semiconductor devices. It should be appreciated that not every process step may be described below, and that one of ordinary skill in the art would understand that additional, related and non-related steps (e.g., various cleaning steps) may be performed throughout the method 300. Additionally, the method 300 is described below in regard to the semiconductor device 102 with the understanding the method 300 may also be applied to semiconductor device 104, as well other semiconductor devices that are to be bond together.

Figure 4:
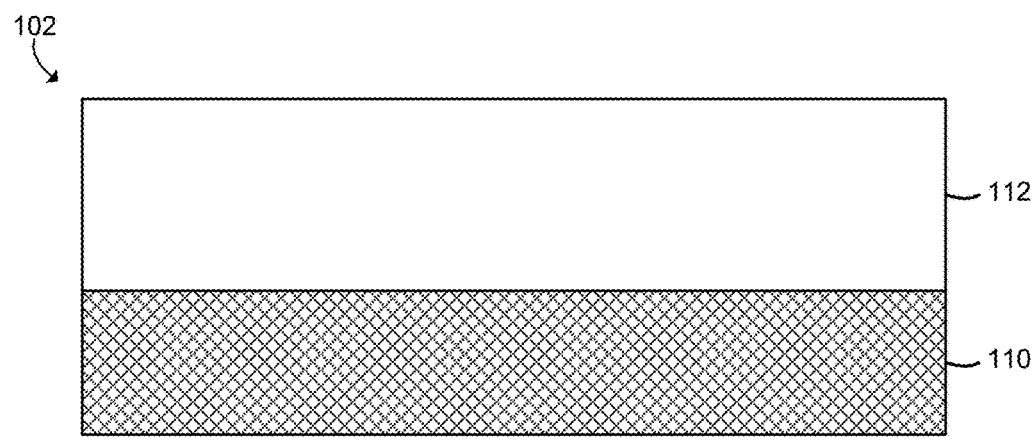
FIG. 4 is a cross-sectional, elevation view of at least one embodiment of a semiconductor device subsequent to the formation of an insulator layer on a semiconductor substrate of the semiconductor device during the performance of the method of FIGS. 3A-3B.

The method 300 begins with block 302 in which the insulator layer 112 is formed on the silicon substrate 110 as shown in FIG. 4. The insulator layer 112 may be embodied as any type of insulator material capable of supporting the diffusion barrier layer 114 as described above in regard to the embodiment of FIG. 1 or otherwise being bonded to itself as described above in regard to the embodiment of FIG. 2. In the illustrative embodiment, the insulator layer 112 is embodied as a silicon oxide layer formed from Tetraethyl Orthosilicate (TEOS).

Figure 5:
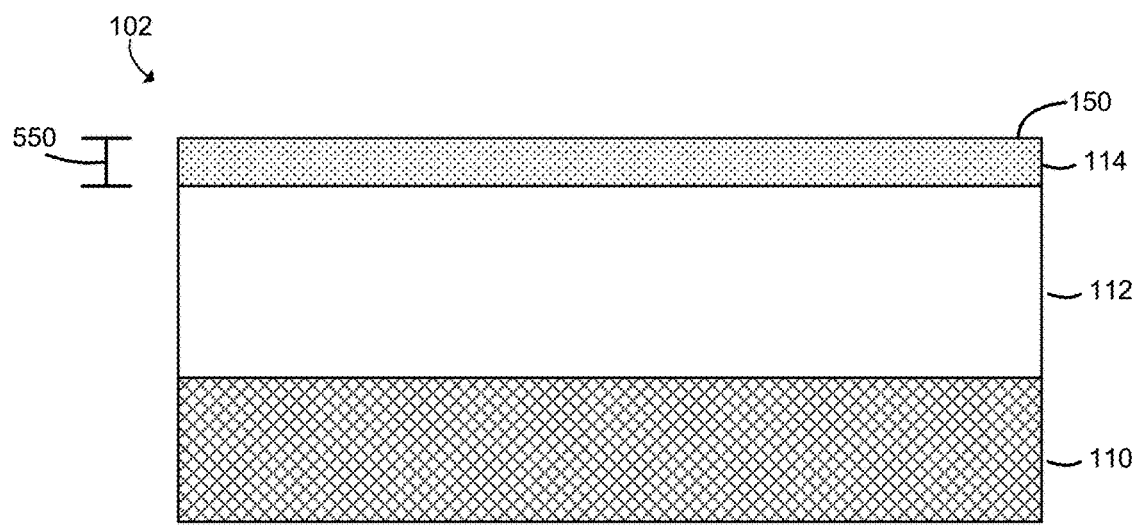
FIG. 5 is a cross-sectional, elevation view of at least one embodiment of the semiconductor device of FIG. 4 subsequent to the formation of a diffusion barrier layer on the insulator layer of the semiconductor device during the performance of the method of FIGS. 3A-3B.

After the insulator layer 112 has been formed on the silicon substrate 110, the diffusion barrier layer 114 is formed on the insulator layer 112 in block 304 and as shown in FIG. 5. As discussed above, the diffusion barrier layer 114 may be embodied as any type of material capable of restricting or otherwise limiting the diffusion of the metallic bonding pads 120 into the insulator layer 112 during subsequent annealing treatment, as discussed below in regard to block 336. In the illustrative embodiment, the diffusion barrier layer 114 is embodied as a silicon carbon nitride layer, which is formed on the insulator layer 112 via a deposition procedure as shown in block 306 (e.g., via chemical vapor deposition (CVD), plasma-enhanced chemical vapor deposition (PECVD), etc.). The diffusion barrier layer 114 is deposited or otherwise formed to have a thickness 550 sufficient to limit or restrict the diffusion of the metallic bonding pads 120 during the annealing process. For example, in the illustrative embodiment, the diffusion barrier layer 114 is formed to have a thickness in the range of 30 to 100 nanometers. However, in other embodiments as discussed above in regard to FIG. 3, the semiconductor device 102 may be devoid of the diffusion barrier layer 114 and, in such embodiment, block 304 of method 300 may be skipped.

Figure 6:
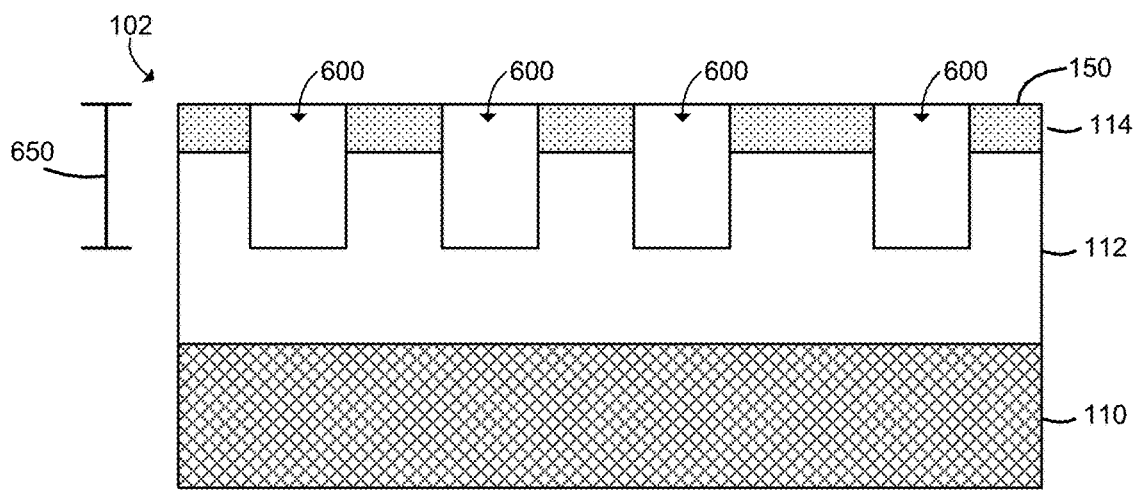
FIG. 6 is a cross-sectional, elevation view of at least one embodiment of the semiconductor device of FIG. 5 subsequent to the formation of a number of recesses in the diffusion barrier layer and insulator layers of the semiconductor device during the performance of the method of FIGS. 3A-3B.

Referring back to FIG. 3A, after the diffusion barrier layer 114 has been formed on the insulator layer 112 or if no diffusion barrier layer 114 is used, the method 300 advances to block 308. In block 308 recesses are formed in the semiconductor device 102 to receive the metallic bonding pads 120. To do so, in block 310, the diffusion barrier layer 114 (or the insulator layer 112 in embodiments devoid of the diffusion barrier layer 114) is masked and etched to form recesses 600 as shown in FIG. 6. Any etching process capable of forming the recesses 600 in the diffusion barrier layer 114 and/or the insulator layer 112 may be used. Additionally, the number and size of the recesses 600 formed in the diffusion barrier layer 114 and/or insulator layer 112 may be dependent on the size of the semiconductor device 102 (e.g., the size of the semiconductor wafer, die, or "chip"), the interconnectivity requirements of the semiconductor device 102, and/or other characteristics of the semiconductor device 102. In the illustrative embodiment, the recesses 600 are formed to have a depth 650 sufficient to extend through the diffusion barrier layer 114 and into the insulator layer 112. For example, in the illustrative embodiment, the recesses 600 are formed to have a depth of about 500 nanometers, but may be deeper or shallower in other embodiments.

Figure 7:
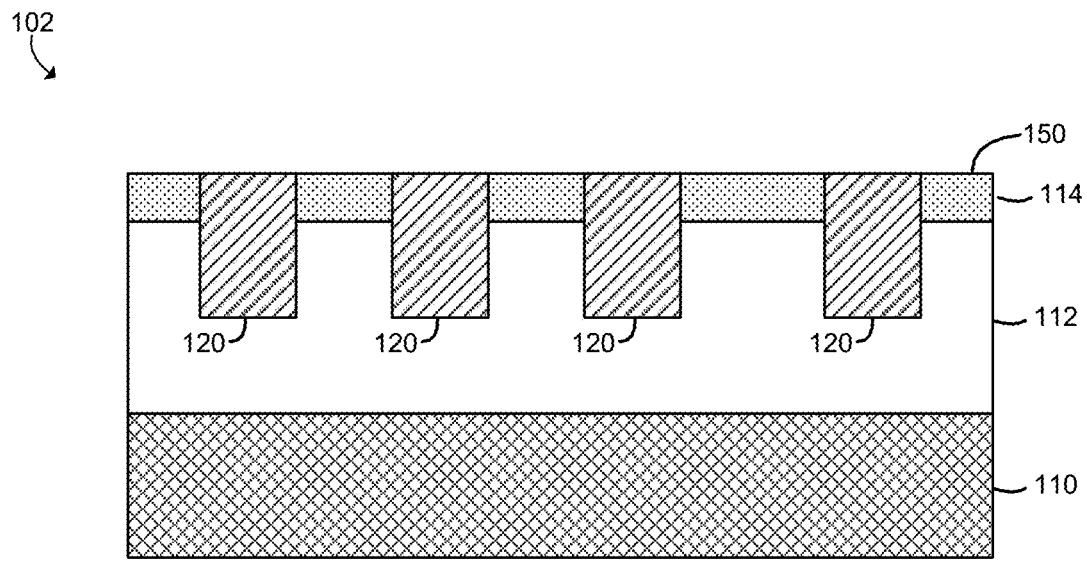
FIG. 7 is a cross-sectional, elevation view of at least one embodiment of the semiconductor device of FIG. 6 subsequent to the formation of metallic pads in the recesses formed in the blocking and insulator layers of the semiconductor device during the performance of the method of FIGS. 3A-3B.

Referring again back to FIG. 3A, after the recesses 600 have been formed in the semiconductor device 102, a metallic bonding pad 120 is formed in each of the recesses 600 in block 312 and as shown in FIG. 7. As discussed above, the metallic bonding pads 120 may be formed from any suitable metal capable of bonding with itself. For example, in the illustrative embodiment in block 314, Copper (Cu) is deposited in the recesses 600 to form Copper (Cu) bonding pads 120 (e.g., via an electro plating deposition procedure). The recesses 600 may be overfilled during the formation of block 312 and subsequently recessed back into the recesses 600 during a subsequent planarization process as discussed below in regard to lock 316. Illustratively, the metallic bonding pads 120 are "dummy" pads and do not provide electrical interconnection to electrical devices of the semiconductor device 102; however, in other embodiments, one or more of the metallic bonding pads 120 may provide electrical connection to various electrical devices formed in the semiconductor device 102 (e.g., to establish electrical interconnection between the semiconductor devices 102, 104).

Referring back to FIG. 3A, after the metallic bonding pads 120 have been formed in the semiconductor device 102, the method 300 advances to block 316 in which the bonding surface 150 (i.e., the upper surface of the diffusion barrier layer 114) is processed to prepare (e.g., to planarize) the bonding surface 150 for bonding. Any number and type of surface processes may be performed in block 316 to prepare the bonding surface 150. For example, in the illustrative embodiment in block 318, a chemical mechanical polishing (CMP) or other planarization process may be performed on the bonding surface 150 of the semiconductor device 102. Additionally, as discussed above, the planarization process may be tuned so as to remove a sufficient amount of the metallic bonding pads 120 such that the metallic bonding pads 120 (e.g., the Copper (Cu) bonding pads) are slightly recessed from the upper surface of the diffusion barrier layer 114 to allow the metallic bonding pads 120 to expand during the subsequent annealing process of block 336. The expansion of each metallic bonding pad 120 of the semiconductor device 102 into a corresponding metallic bonding pad 120 of the other semiconductor device 104 results in the direct bonding of the metallic bonding pads 120.

Figure 8:
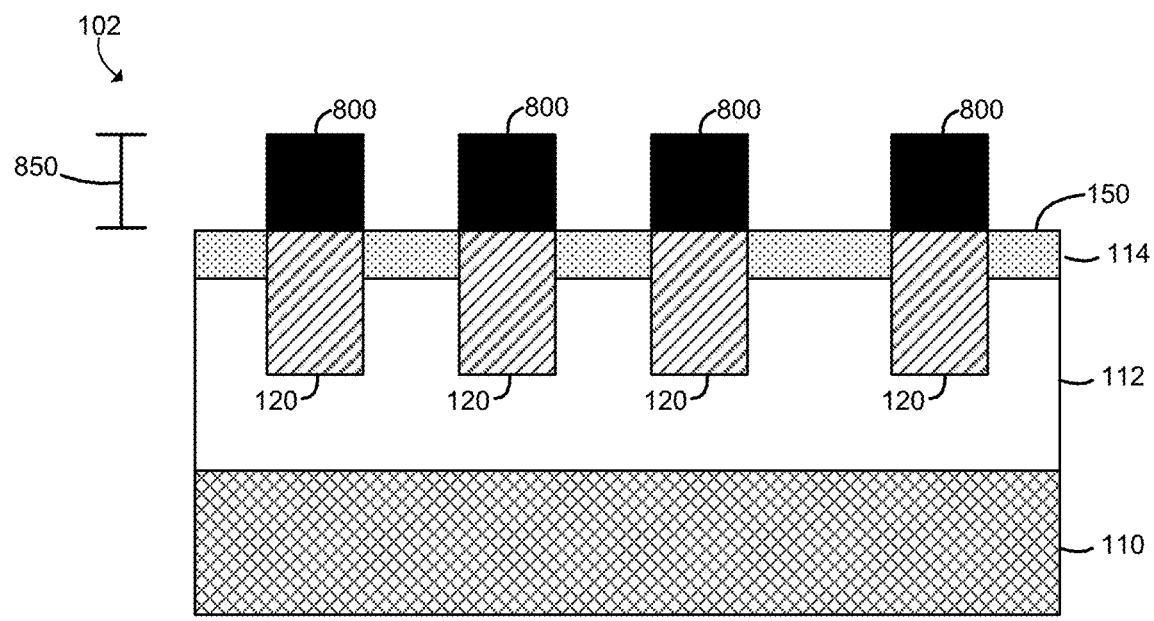
FIG. 8 is a cross-sectional, elevation view of at least one embodiment of the semiconductor device of FIG. 7 subsequent to the formation of a blocking layer on each metallic pad of the semiconductor device during the performance of the method of FIGS. 3A-3B.

After the bonding surface 150 of the semiconductor device 102 has been processed in block 316, a blocking layer 800 may be formed on each of the metallic bonding pads 120 as shown in FIG. 8. As discussed above, the blocking layers 800 are formed from material capable of limiting or reducing the exposure of the metallic bonding pads 120 to a subsequent surface treatment, as discussed below in regard to block 326. The blocking layers 800 are formed on the metallic bonding pads 120 to have a thickness 850, which may be dependent on the particular surface treatment to be performed. For example, in the illustrative embodiment, the blocking layers 800 have a thickness in the range of 1 to 5 nanometers (e.g., about 3 nanometers in the illustrative embodiment), but may be thicker or thinner in other embodiments.

In the illustrative embodiment, the blocking layers 800 are formed from a self-assembled monolayer (SAM), which is formed on the Copper (Cu) bonding pads 120 in block 322. To do so, in block 324, the SAM may be deposited on the Copper bonding pads 120 using a spin coating process; however, other methods of depositing or otherwise forming the SAM on the metallic bonding pads 120 may be used in other embodiments. Illustratively, the SAM includes a hydrocarbon chain attached to a selective head group. The selective head group is organic (e.g., including only Carbon (C), Oxygen (O) and/or Hydrogen (H)), which facilitates its removal from the metallic (e.g., Copper (Cu)) bonding pads 120 by the subsequent surface treatment of block 326 while ensuring the selective head group does not form any exotic bonds with the metallic bonding pads 120 (e.g., a Sulfur (S)-Copper (Cu) bond). Conversely, typical SAMs may be thiol-based (i.e., sulfur-containing), which can adversely interact with the metallic bonding pads 120 (e.g., with Copper (Cu)) and reduce the bonding strength and performance of the metallic bonding pads 120.

Figure 9:
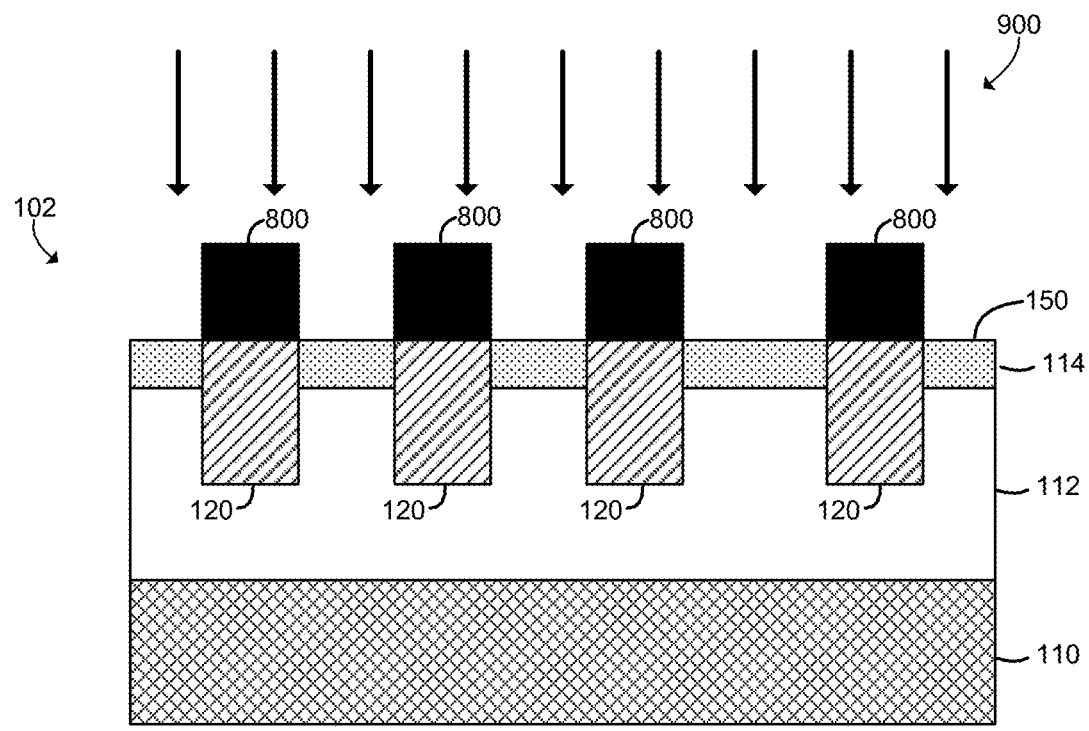
FIG. 9 is a cross-sectional, elevation view of at least one embodiment of the semiconductor device of FIG. 8 undergoing a bonding surface treatment during the performance of the method of FIGS. 3A-3B.

After the blocking layers 800 have been formed on the metallic bonding pads 120, the method 300 advances to block 326 of FIG. 3B. In block 326, a surface treatment is performed on the bonding surface 150 of the semiconductor device 102 as shown in FIG. 9 and indicated by arrows 900. For example, in block 328, a surface activation plasma (SAP) treatment is applied to the bonding surface 150 to prepare the bonding surface 150 for bonding. The SAP treatment prepares or "activates" the bonding surface 150 of the semiconductor device 102 by establishing dangling bonds on the bonding surface 150 (i.e., on the diffusion barrier layer 114), which facilitates hydrogen bonding of the bonding surface 150.

As discussed above, the surface treatment (e.g., the SAP treatment) is selected such that the surface treatment properly prepares the bonding surface 150 (e.g., creates the dangling bonds on the diffusion barrier layer 114) while contemporaneously removing or substantially removing the blocking layer 800 from the metallic bonding pads 120. For example, in block 330, the type of plasma of the SAP treatment may be selected and the power of the SAP treatment may be selected in block 332.

One consideration in the selection of the surface treatment is the resulting bond strength between the semiconductor devices 102, 104. Table 1 below shows test results of the bond strength of the hybrid bonding of the semiconductor devices 102, 104 after an $N_2$ SAP treatment and an $O_2$ SAP treatment at 200 Watts of power. As shown, the $O_2$ SAP treatment produces an increased bond strength at 200 Watts, relative to the $N_2$ SAP treatment, for semiconductor devices 102, 104 including the diffusion barrier layer 114 (see FIG. 1). However, the $N_2$ SAP treatment produces an increased bond strength at 200 Watts, relative to the $O_2$ SAP treatment, for TEOS semiconductor devices 102, 104 that do not include the diffusion barrier layer 114 (see FIG. 2).

TABLE 1

| Layer | $N_2$ Plasma at 200 W | $O_2$ Plasma at 200 W |
|---|---|---|
| SiCN | 0.52 J/m² | 1.19 J/m² |
| TEOS | 0.66 J/m² | 0.29 J/m² |

Figure 14:
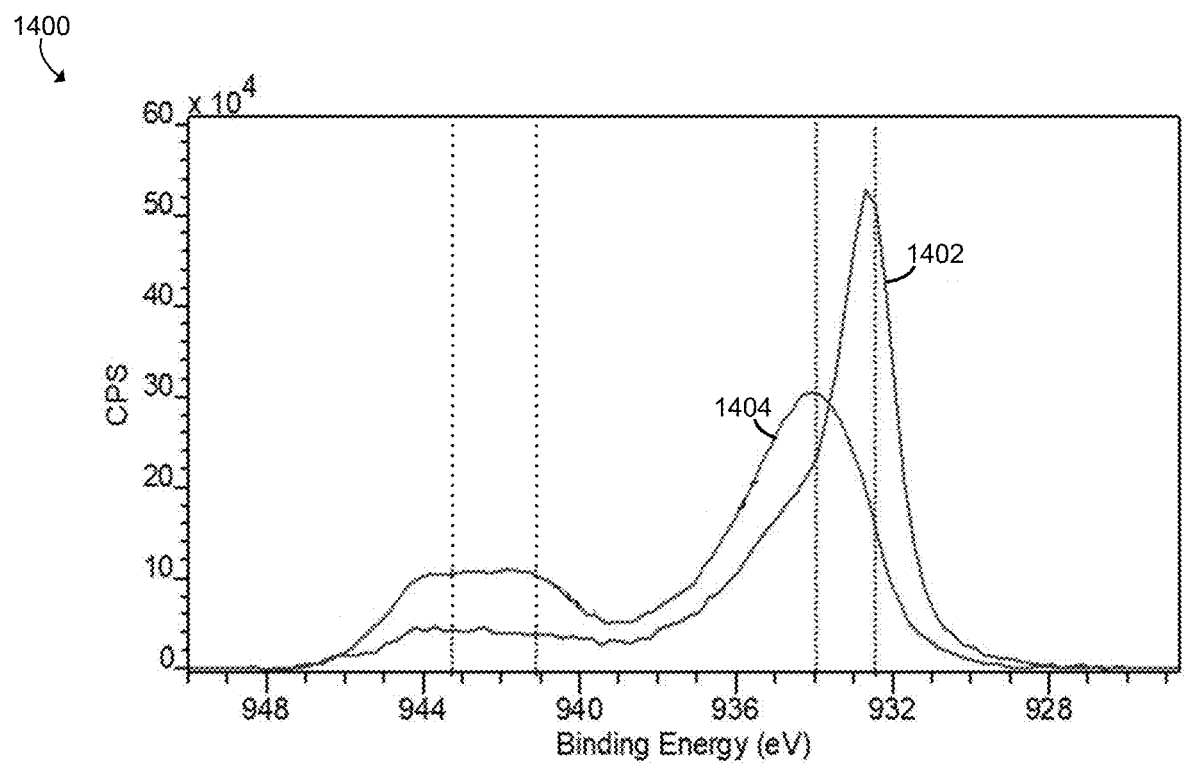
FIG. 14 is a simplified graph of illustrating results of an X-ray Photoemission Spectrometry (XPS) analysis of the oxidation of the metallic bonding pads of a semiconductor device prior to and subsequent to a bonding surface treatment using an Oxygen Surface Activation Plasma (SAP) treatment.

Another consideration in the selection of the surface treatment is the oxidation of metal of the bonding pads 120 resulting from the selected surface treatment. For example, a graph 1400 of FIG. 14 illustrates X-Ray Photoemission Spectrometry (XPS) results of an $O_2$ SAP treatment on Copper (Cu) of Copper bonding pads without application of a blocking layer 800. The graph 1400 has an ordinate (y) axis measured in counts-per-second (CPS), which is indicative of the intensity of the resulting signal, and an abscissa (x) axis measured in binding energy, which is indicative of the value of energy for the particular element of interest (e.g., Copper oxide (Cu') "satellites"). The graph 1400 includes a graph curve 1402 indicating the XPS results of Copper bonding pads without the $O_2$ SAP treatment and a graph curve 1404 indicating the XPS results of the Copper bonding pads subsequent to the $O_2$ SAP treatment. The total area under the curves 1402, 1404 is indicative of the total amount of oxidation of the Copper bonding pads (e.g., production of Cu' oxide "satellites"). As indicated by the graph 1400, the $O_2$ SAP treatment produces an increased amount of Copper oxides relative to the untreated Copper bonding pads.

Figure 15:
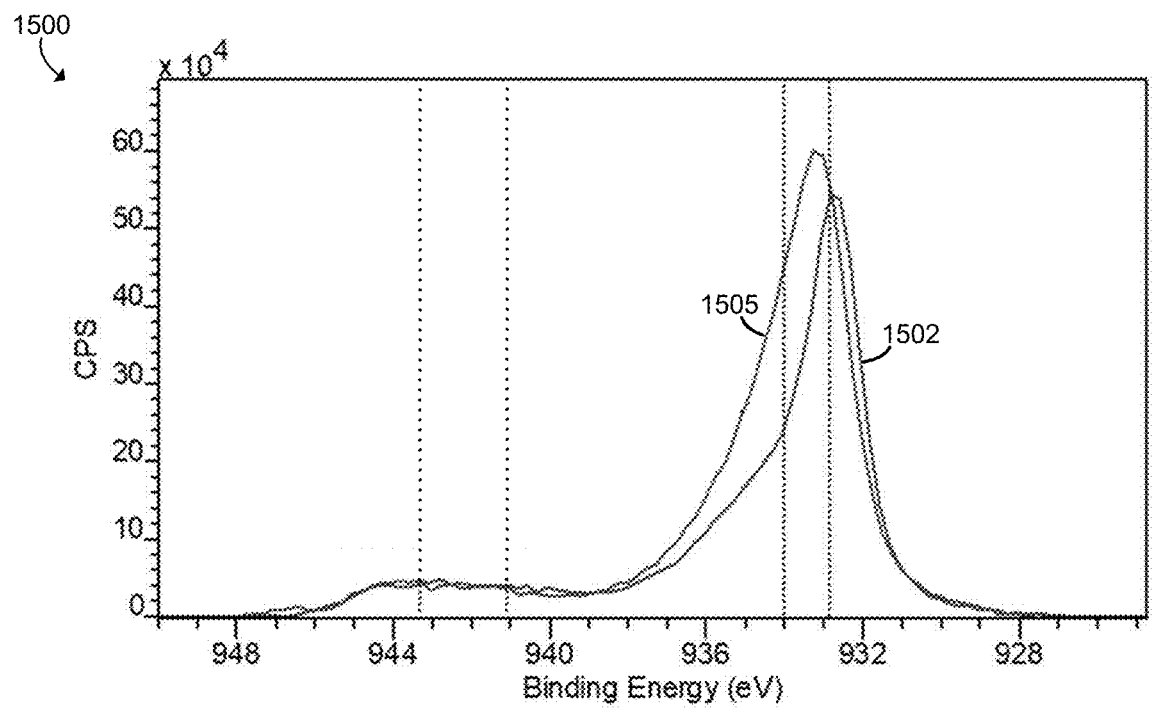
FIG. 15 is a simplified graph of illustrating results of an XPS analysis of the oxidation of the metallic bonding pads of a semiconductor device prior to and subsequent to a bonding surface treatment using an Nitrogen SAP treatment.

Similarly, a graph 1500 of FIG. 15 illustrates XPS results of an $N_2$ SAP treatment on Copper (Cu) bonding pads. The graph 1500 includes a graph curve 1502 indicating the XPS results of Copper bonding pads without the $N_2$ SAP treatment and a graph curve 1504 indicating the XPS results of the Copper bonding pads subsequent to the $N_2$ SAP treatment. Again, the total area under the curves 1502, 1504 is indicative of the total amount of oxidation of the Copper bonding pads (e.g., production of $Cu^{2+}$ oxide "satellites"). As indicated by the graph 1500, the $N_2$ SAP treatment does not produce significantly more Copper oxides relative to the untreated Copper bonding pads.

A further consideration in the selection of the surface treatment is the leakage current of the bonding surface 150 of the semiconductor 102 post-SAP treatment. For example, a graph 1600 illustrates a leakage current analysis of the bonding surface 150 of the semiconductor 102 subsequent to a group 1602 of $O_2$ SAP treatments and a group 1604 of $N_2$ SAP treatments. The group 1602 of $O_2$ SAP treatments includes a graph curve 1610 illustrating results of a 50 Watt $O_2$ SAP treatment, a graph curve 1612 illustrating results of a 100 Watt $O_2$ SAP treatment, and a graph curve 1614 illustrating results of a 200 Watt $O_2$ SAP treatment. Similarly, the group 1604 of $N_2$ SAP treatments includes a graph curve 1620 illustrating results of a 50 Watt $N_2$ SAP treatment, a graph curve 1622 illustrating results of a 100 Watt $N_2$ SAP treatment, and a graph curve 1624 illustrating results of a 200 Watt $N_2$ SAP treatment. As shown in the graph 1600, each of the $O_2$ SAP treatments produce a higher leakage current than each of the $N_2$ SAP treatments.

Figure 17:
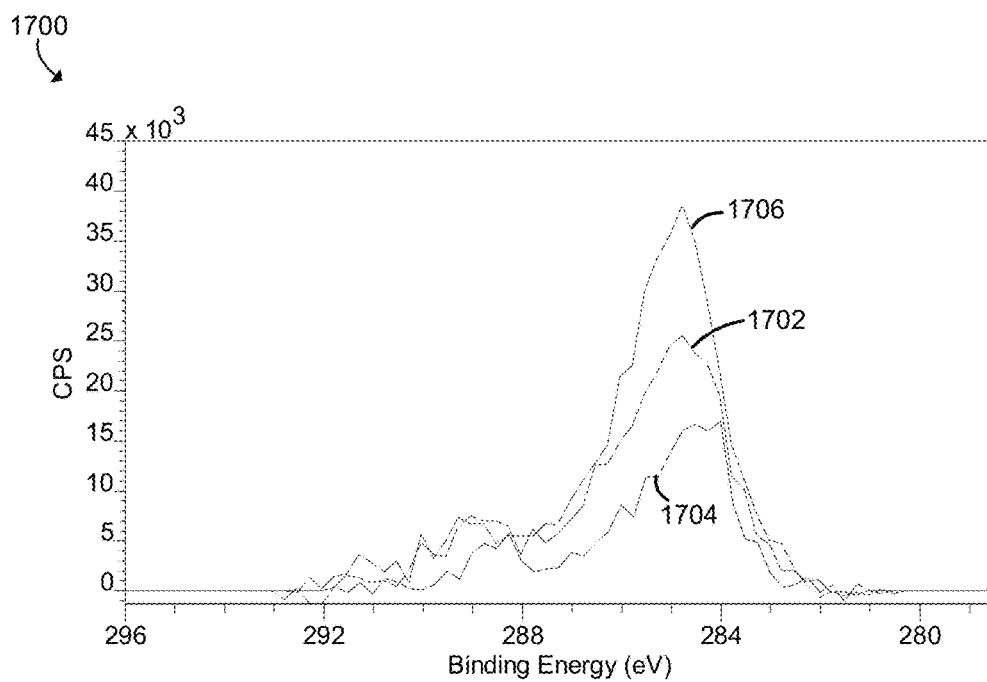
FIG. 17 is a simplified graph illustrating results of an XPS analysis of Carbon formed on a Copper (Cu) plate prior to and subsequent to a bonding surface treatment using an Oxygen and Nitrogen SAP treatments.
Figure 18:
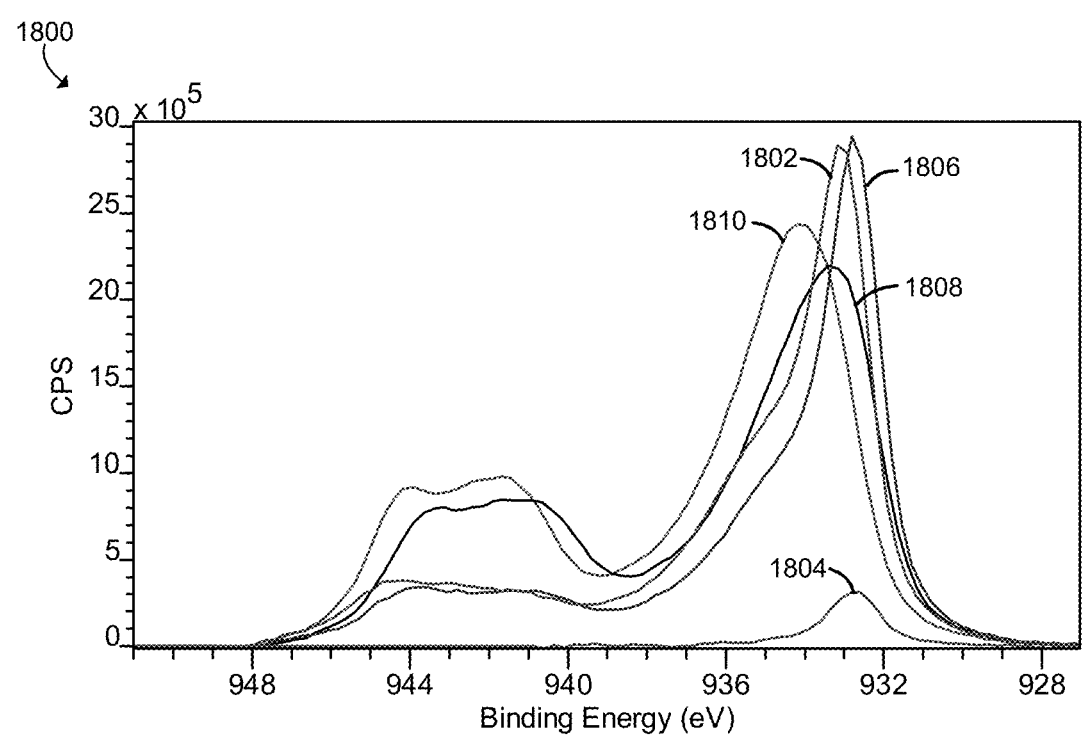
FIG. 18 is a simplified graph illustrating the results of an XPS analysis of the oxidation of the metallic bonding pads of a semiconductor device prior to and subsequent to a bonding surface treatment using an Oxygen Surface Activation Plasma (SAP) treatment after formation a self-assembled monolayer (SAM) on each metallic pad of the semiconductor device and at varying power levels.

Another consideration in the selection of the surface treatment is the effectiveness of the SAP treatment in removing the blocking layer 800 from the metallic bonding pads 120. One indication of the effectiveness of the SAP treatment in removing the blocking layer 800 is the ability of the SAP treatment to remove adventitious Carbon (C) from Copper (Cu). For example, a graph 1700 of FIG. 17 illustrates XPS results of an $O_2$ SAP treatment and an $N_2$ SAP treatment on a copper plate including some amount of Carbon. The graph 1700 includes a graph curve 1702 indicating the XPS results of a Copper plate without any SAP treatment (i.e., a measurement of naturally occurring Carbon build-up), a graph curve 1704 indicating the XPS results of a Copper plate after an $O_2$ SAP treatment, and a graph curve 1706 indicating the XPS results of a Copper plate after an $N_2$ SAP treatment. The total area under the curves 1702, 1704, 1706 is indicative of the amount of Carbon on the Copper plate (e.g., on the metallic bonding pads 120), which is itself indicative of the performance of the SAP treatment in removing the SAM blocking layer (which is formed primarily from Carbon). As shown in the graph 1700, the $O_2$ SAP treatment results in a lower amount of Carbon remaining on the metallic bonding pad 120 relative to the $N_2$ SAP treatment, which indicates the $O_2$ SAP treatment performs better in the removal of the SAM blocking layer. It should be appreciated that the term "remove" as used herein in relation to the removal of the SAM blocking layer refers to the reduction of the amount of SAM blocking layer on the metallic bonding pads 120 to an extent such that the SAM blocking layer no longer forms a continuous layer on the respective metallic bonding pad 120 and that at least a portion of the underlying surface of the metallic bonding pads 120 may be exposed. That is, it should be appreciated that some amount of SAM, although minor, may remain on the metallic bonding pads 120 after the performance of the surface treatment.

Figure 16:
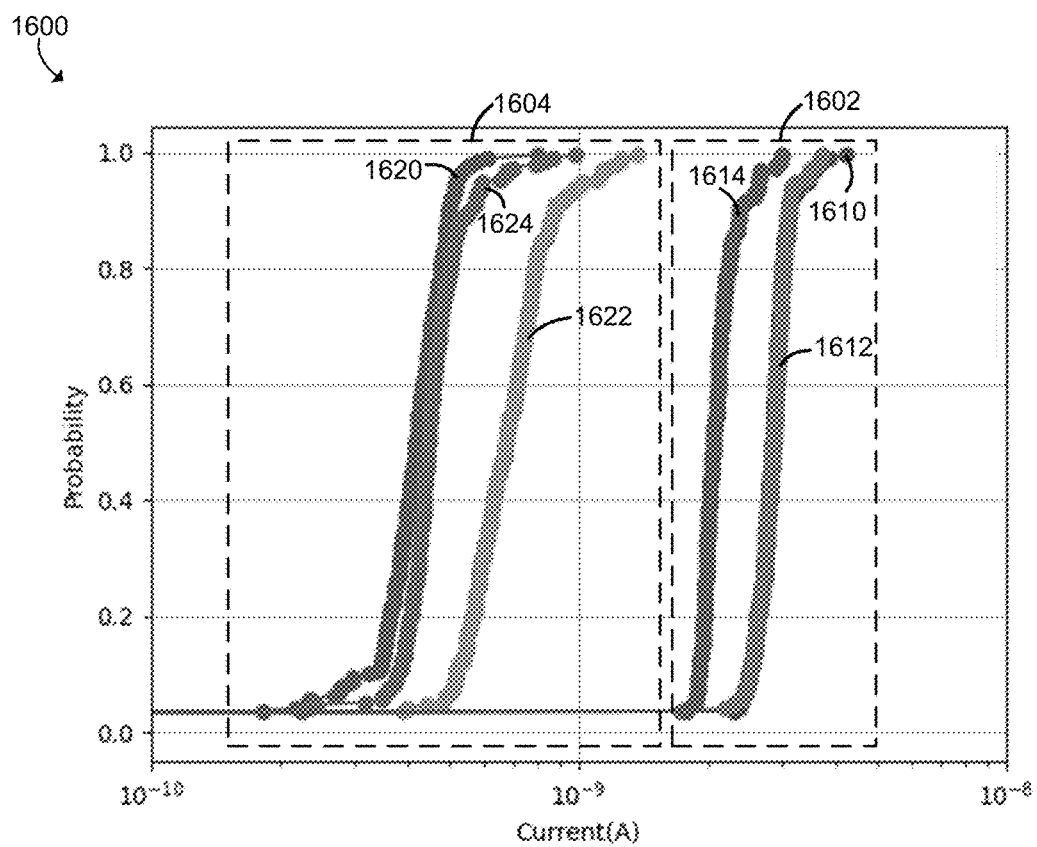
FIG. 16 is a simplified graph illustrating results of a leakage current analysis of the bonding surface of a semiconductor device subsequent to a bonding surface treatment using Oxygen and Nitrogen SAP treatments.

As such, while the $N_2$ SAP treatment may produce less oxidation of the metallic bonding pads 120 as shown in FIGS. 14 and 15 and a lower leakage current as shown in FIG. 16, the $O_2$ SAP treatment performs better at the removal of the blocking layer 800. However, by selecting an appropriate power level of the $O_2$ SAP treatment, the $O_2$ SAP treatment can be tuned to effectively treat the bonding surface 150 while removing the SAM blocking layer 800 without significant oxidation of the metallic bonding pads 120. For example, a graph 1800 illustrates XPS results of an $O_2$ SAP treatment on Copper (Cu) of Copper bonding pads at different power settings. The graph 1800 includes a graph curve 1802 indicating the XPS results on Copper bonding pads pre-SAM formation, a graph curve 1804 indicating the XPS results on Copper bonding pads post-SAM formation and pre-SAP treatment, a graph 1806 indicating XPS results on Copper bonding pads post-$O_2$ SAP treatment at 50 Watts of power, a graph 1808 indicating XPS results on Copper bonding pads post-$O_2$ SAP treatment at 100 Watts of power, and a graph 1806 indicating XPS results on Copper bonding pads post-$O_2$ SAP treatment at 200 Watts of power. As shown in graph 1800, by reducing the $O_2$ SAP treatment to around 50 Watts of power (e.g., in the range of 40-60 Watts of power) the oxidation of the Copper bonding pads is significantly reduced relative to the 100 and 200 Watt $O_2$ SAP treatments. As such, it has been determined that an $O_2$ SAP treatment applied in the power range of 40-60 watts (e.g., 50 Watts) effectively removes the SAM without significant oxidation of the Copper bonding pads. Alternatively, in some embodiments, an $N_2$ SAP treatment may be used if a remaining layer of SAM on the metallic bonding pads 120 is desired (e.g., for shipping or storage purposes).

Figure 10:
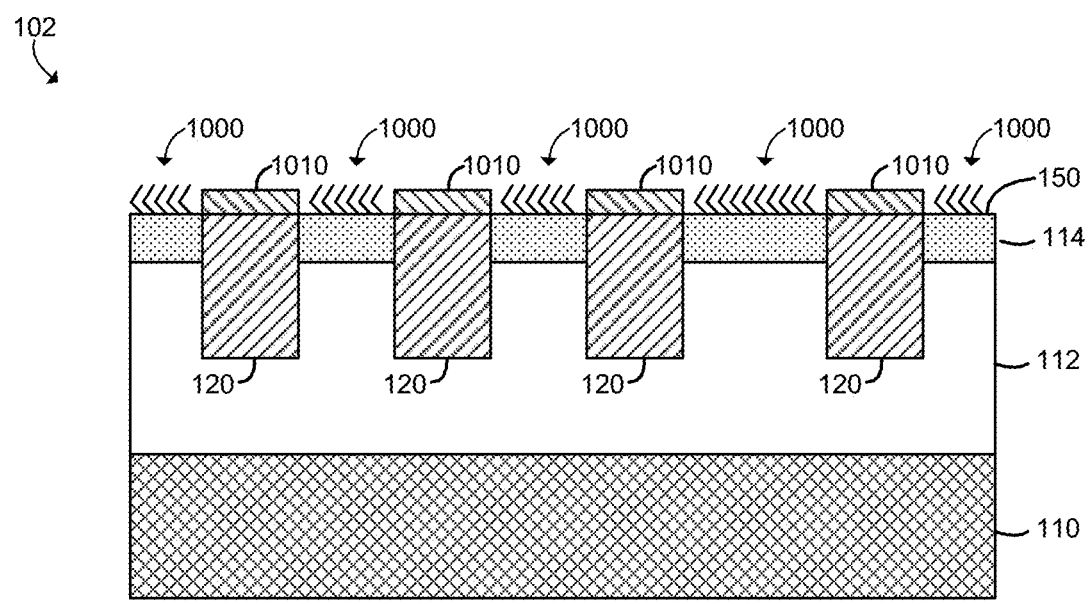
FIG. 10 is a cross-sectional, elevation view of at least one embodiment of the semiconductor device of FIG. 9 subsequent to the bonding surface treatment during the performance of the method of FIGS. 3A-3B.

Referring now to FIG. 10, an illustrative semiconductor device 102 is shown post-surface treated (e.g., post-$O_2$ SAP treatment at 50 Watts). As discussed above, the SAP treatment causes the creation of a number of dangling bonds 1000 on the bonding surface 150 of the semiconductor device 102 (i.e., on the upper surface of the diffusion barrier layer 114 or the upper surface of the insulator layer 112 if no diffusion barrier layer 114 is used). Additionally, a thin layer (e.g., in the range of 1 to 3 nanometers) of Copper oxide ($Cu^{2+}$) 1010 may be formed on the metallic bonding pads 120, which may provide better electrical performance for the semiconductor device 102 relative to $Cu^{1+}$.

Figure 11:
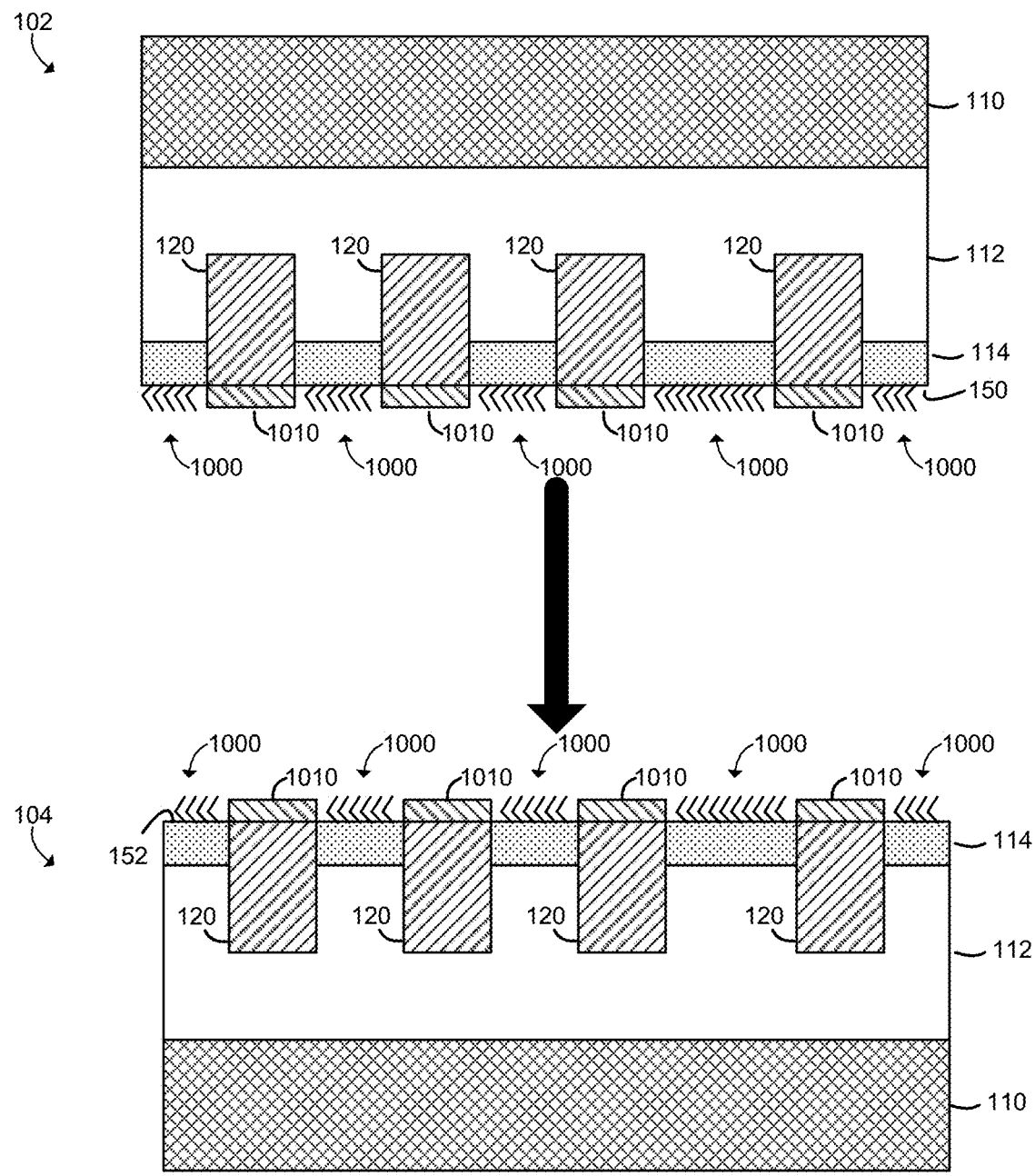
FIG. 11 is a cross-sectional, elevation view of at least one embodiment of the semiconductor device of FIG. 9 and another similarly prepared semiconductor device in the process of being physically contacted to each other during the performance of the method of FIGS. 3A-3B.
Figure 12:
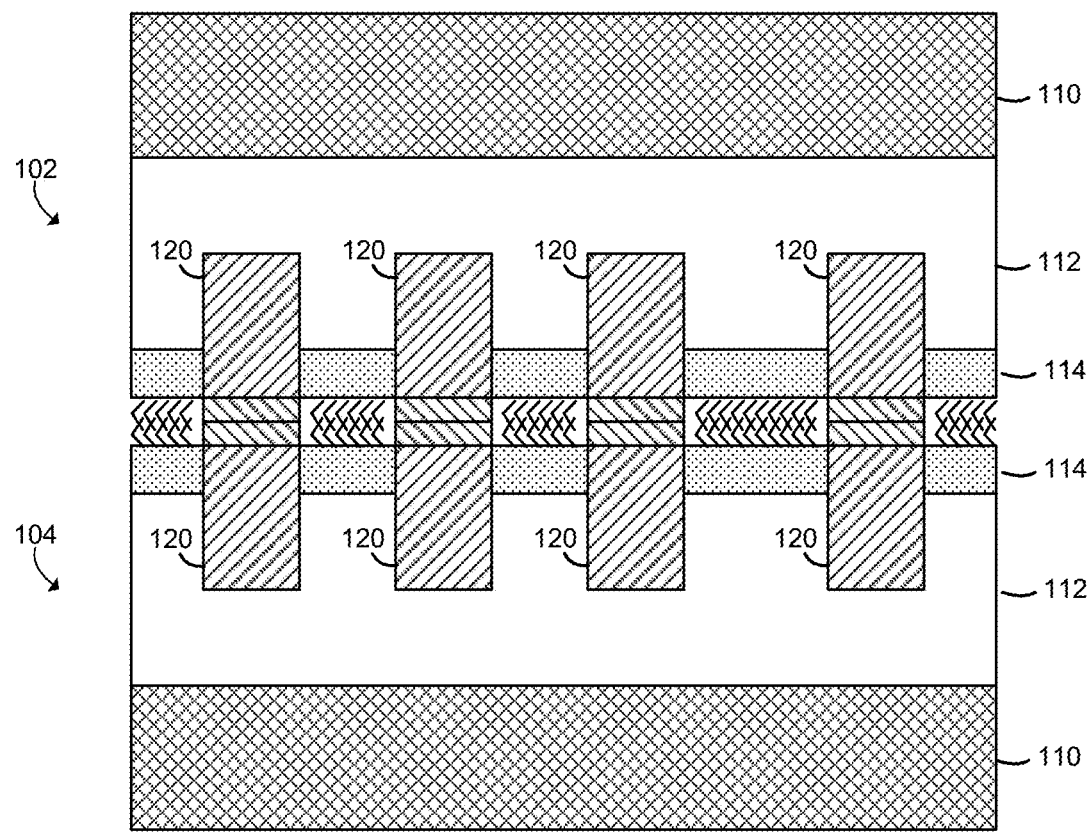
FIG. 12 is a cross-sectional, elevation view of at least one embodiment of the semiconductor devices of FIG. 11 being in physical contact with each other in preparation for a bonding procedure during the performance of the method of FIGS. 3A-3B.
Figure 13:
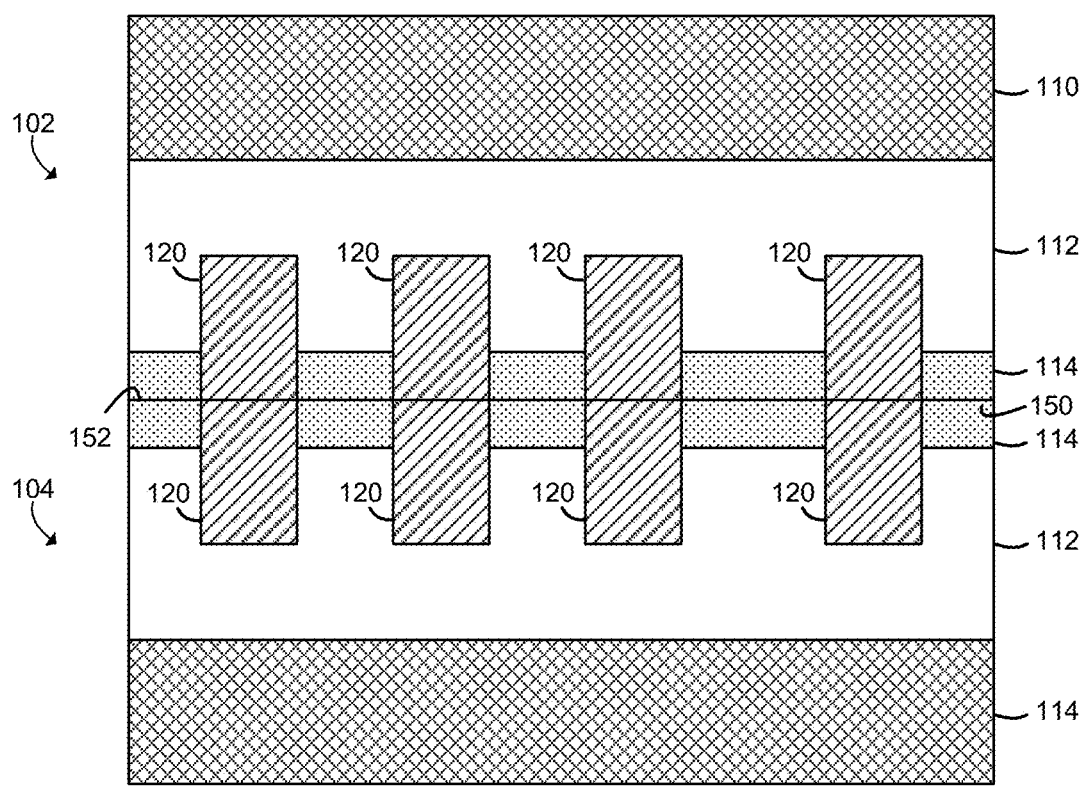
FIG. 13 is a cross-sectional, elevation view of at least one embodiment of the semiconductor devices of FIG. 12 subsequent to the bonding procedure during the performance of the method of FIGS. 3A-3B.

Referring back to FIG. 3B, after the surface treatment has been performed on the bonding surfaces of the semiconductor device 102, the semiconductor device 102 is bonded together with the semiconductor device 104. As discussed above, in the illustrative embodiment, the semiconductor device 104 is likewise treated using the methodology of method 300. To prepare the semiconductor devices 102, 104 for bonding, the post-surface treated semiconductor devices 102, 104 are brought into physical contact as shown in FIGS. 11 and 12. Once physically contacting each other, the semiconductor devices 102, 104 are annealed in block 336 of FIG. 3B, which produces the semiconductor device structure 100 shown in FIG. 13. The particular annealing process used in block 336 may be selected based on various characteristics of the semiconductor devices 102, 104. For example, in an illustrative embodiment, the semiconductor devices 102, 104 may be annealed at a temperature in the range of about 100 degrees Celsius to about 400 degrees Celsius, although higher temperatures may be used in some embodiments. Once the annealing process is completed, the semiconductor devices 102, 104 are hybrid bonded to each other as discussed above.

While the disclosure has been illustrated and described in detail in the drawings and foregoing description, such an illustration and description is to be considered as illustrative and not restrictive in character, it being understood that only illustrative embodiments have been shown and described and that all changes and modifications that come within the spirit of the disclosure are desired to be protected.

There are a plurality of advantages of the present disclosure arising from the various features of the methods, apparatuses, and systems described herein. It will be noted that alternative embodiments of the methods, apparatuses, and/or systems of the present disclosure may not include all of the features described yet still benefit from at least some of the advantages of such features. Those of ordinary skill in the art may readily devise their own implementations of the methods, apparatuses, and systems that incorporate one or more of the features of the present invention and fall within the spirit and scope of the present disclosure as defined by the appended claims.

The invention claimed is:

1. A method for hybrid bonding a semiconductor device, the method comprising:
   forming a blocking layer on a metallic bonding pad formed in a bonding surface of a first semiconductor device;
   performing a surface treatment on the bonding surface of the first semiconductor device, wherein the surface treatment comprises creating a plurality of dangling bonds on the bonding surface of the first semiconductor device to increase a bonding strength of the bonding surface of the first semiconductor device and substantially remove the blocking layer from the metallic bonding pad, and wherein the blocking layer limits exposure of the metallic bonding pad to the surface treatment; and
   contacting the bonding surface of the first semiconductor device to a bonding surface of second semiconductor device.

2. The method of claim 1, wherein forming a blocking layer on the metallic bonding pad comprises forming a self-assembled monolayer (SAM) on the metallic bonding pad.

3. The method of claim 2, wherein forming the self-assembled monolayer (SAM) on the metallic bonding pad comprises spin coating the SAM onto the metallic bonding pad.

4. The method of claim 1, wherein performing the surface treatment on the bonding surface of the first semiconductor device comprises performing a surface activation plasma (SAP) treatment on the bonding surface of the first semiconductor device.

5. The method of claim 4, wherein performing the surface activation plasma (SAP) treatment comprises performing an oxygen SAP treatment on the bonding surface of the first semiconductor device.

6. The method of claim 5, wherein performing the oxygen surface activation plasma (SAP) treatment comprises performing an oxygen SAP treatment on the bonding surface of the first semiconductor device at a power level between 40 watts and 60 watts.

7. The method of claim 6, wherein performing the oxygen surface activation plasma (SAP) treatment comprises performing a 50 watt oxygen SAP treatment on the bonding surface of the first semiconductor device.

8. The method of claim 1, further comprising:
   forming an insulator layer on a silicon substrate of the semiconductor device; and
   forming a diffusion barrier layer on the insulator layer, wherein the diffusion barrier layer comprises the bonding surface of the first semiconductor device and is configured to restrict diffusion of the metallic bonding pad during the annealing of the first and second semiconductor devices.

9. The method of claim 8, wherein forming the diffusion barrier layer on the insulator layer comprises forming a silicon carbon nitride layer on the insulator layer.

10. The method of claim 1, wherein:
    forming the blocking layer on the metallic bonding pad comprises forming a self-assembled monolayer (SAM) on the metallic bonding pad, and
    performing the surface treatment on the bonding surface of the first semiconductor device comprises performing an oxygen surface activation plasma (SAP) treatment on the bonding surface of the first semiconductor device.

11. The method of claim 10, wherein performing the oxygen surface activation plasma (SAP) treatment comprises performing a 50 watt oxygen SAP treatment on the bonding surface of the first semiconductor device.

12. The method of claim 1, further comprising:
    forming a blocking layer on a metallic bonding pad formed in the bonding surface of the second semiconductor device; and
    performing the surface treatment on the bonding surface of the second semiconductor device, wherein the surface treatment is configured to increase a bonding strength of the bonding surface of the second semiconductor device and substantially remove the blocking layer from the metallic bonding pad of the second semiconductor, and wherein the blocking layer limits exposure of the metallic bonding pad of the second semiconductor to the surface treatment.

13. The method of claim 12, wherein:
    forming the blocking layer on the metallic bonding pad of the second semiconductor device comprises forming a self-assembled monolayer (SAM) on the metallic bonding pad of the second semiconductor device, and performing the surface treatment on the bonding surface of the second semiconductor device comprises performing an oxygen surface activation plasma (SAP) treatment on the bonding surface of the second semiconductor device.

14. A method for hybrid bonding a semiconductor device, the method comprising:

forming an insulator layer on a silicon substrate of a first semiconductor device;

forming a diffusion barrier layer on the insulator layer, wherein the diffusion barrier layer comprises silicon carbon nitride layer;

forming a plurality of metallic bonding pads in the diffusion barrier layer;

forming a self-assembled monolayer (SAM) on each metallic bonding pad of the plurality of metallic bonding pads;

performing a surface activation plasma (SAP) treatment on the diffusion barrier layer, wherein the SAP treatment is configured to increase a bonding strength of the diffusion barrier layer and substantially remove the SAM from each of the metallic bonding pads, and wherein the blocking layer limits exposure of each of the metallic bonding pads to the SAP treatment; and contacting the diffusion barrier layer of the first semiconductor device to a bonding surface of second semiconductor device, wherein the diffusion barrier layer is configured to restrict diffusion of the metallic bonding pads in the diffusion barrier layer during the annealing of the first and second semiconductor devices.

15. The method of claim 14, wherein performing the surface activation plasma (SAP) treatment on the diffusion barrier layer comprises performing an oxygen SAP treatment on the diffusion barrier layer.

16. The method of claim 15, wherein performing the oxygen surface activation plasma (SAP) treatment comprises performing an oxygen SAP treatment on the diffusion barrier layer at a power level between 40 watts and 60 watts.

17. The method of claim 16, wherein performing the oxygen surface activation plasma (SAP) treatment comprises performing a 50 watt oxygen SAP treatment on the diffusion barrier layer.

18. A method for hybrid bonding semiconductor devices, the method comprising:

forming a self-assembled monolayer (SAM) on a metallic bonding pad formed in a bonding surface of a first semiconductor device and on a metallic bonding pad formed in a bonding surface of a second semiconductor device;

performing a surface activation plasma (SAP) treatment on the bonding surface of the first semiconductor device and on the bonding surface of the second semiconductor device, wherein the SAP treatment is configured to increase a bonding strength of the bonding surface of the first and second semiconductor devices and substantially remove the SAM from the metallic bonding pad of the first and second semiconductor device, and wherein the SAM limits exposure of the metallic bonding pads to the surface treatment; and contacting the bonding surface of the first semiconductor device to the bonding surface of second semiconductor device.

19. The method of claim 18, further comprising:

forming an insulator layer on a silicon substrate of the first semiconductor device;

forming an insulator layer on a silicon substrate of the second semiconductor device;

forming a first silicon carbon nitride layer on the insulator layer of the first semiconductor device, wherein the first silicon carbon nitride layer comprises the bonding surface of the first semiconductor device and is configured to restrict diffusion of the metallic bonding pad of the first semiconductor device during the annealing of the first and second semiconductor devices; and forming a second silicon carbon nitride layer on the insulator layer of the second semiconductor device, wherein the second silicon carbon nitride layer comprises the bonding surface of the second semiconductor device and is configured to restrict diffusion of the metallic bonding pad of the second semiconductor device during the annealing of the first and second semiconductor devices.

20. A method for hybrid bonding a semiconductor device according to claim 1 further comprising:

annealing the first and second semiconductor devices while the first and second semiconductor devices are in contact with each other to enhance a bond formed between the first and semiconductor device during the step of contacting the bonding surface of the first semiconductor device to the bonding surface of second semiconductor device.

21. A method for hybrid bonding a semiconductor device according to claim 14 further comprising:

annealing the first and second semiconductor devices while the first and second semiconductor devices are in contact with each other to enhance a bond formed between the first and semiconductor device during the step of contacting the diffusion barrier layer of the first semiconductor device to the bonding surface of second semiconductor device.

22. A method for hybrid bonding a semiconductor device according to claim 18 further comprising:

annealing the first and second semiconductor devices while the first and second semiconductor devices are in contact with each other to enhance a bond formed between the first and semiconductor device during the step of contacting the bonding surface of the first semiconductor device to the bonding surface of second semiconductor device.

* * * * *